(12) United States Patent
Saito et al.

(10) Patent No.: US 9,184,408 B2
(45) Date of Patent: Nov. 10, 2015

(54) DISPLAY PANEL AND DISPLAY DEVICE

(71) Applicants: Nobuyoshi Saito, Tokyo (JP);
Tomomasa Ueda, Kanagawa-ken (JP);
Hajime Yamaguchi, Kanagawa-ken (JP); Kentaro Miura, Kanagawa-ken (JP); Shintaro Nakano, Kanagawa-ken (JP); Tatsunori Sakano, Tokyo (JP)

(72) Inventors: Nobuyoshi Saito, Tokyo (JP);
Tomomasa Ueda, Kanagawa-ken (JP);
Hajime Yamaguchi, Kanagawa-ken (JP); Kentaro Miura, Kanagawa-ken (JP); Shintaro Nakano, Kanagawa-ken (JP); Tatsunori Sakano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/721,925

(22) Filed: Dec. 20, 2012

(65) Prior Publication Data

US 2013/0277646 A1    Oct. 24, 2013

(30) Foreign Application Priority Data

Apr. 19, 2012  (JP) ................................. 2012-095914

(51) Int. Cl.
  *H01L 23/00* (2006.01)
  *H01L 51/52* (2006.01)
  *H01L 27/32* (2006.01)
(52) U.S. Cl.
  CPC .............. *H01L 51/52* (2013.01); *H01L 27/326* (2013.01); *H01L 27/3227* (2013.01)
(58) Field of Classification Search
  USPC .......................... 257/40, 72; 313/498; 349/114
  See application file for complete search history.

(56) References Cited

U.S. PATENT DOCUMENTS

| 6,850,312 | B2 * | 2/2005 | Jacobsen et al. ............... 349/187 |
| 8,063,562 | B2 * | 11/2011 | Gomi ............................. 313/512 |
| 2005/0122351 | A1 * | 6/2005 | Yamazaki et al. ................ 347/5 |
| 2009/0128016 | A1 * | 5/2009 | Gomi ............................. 313/504 |
| 2010/0120337 | A1 | 5/2010 | Kuriyama et al. |
| 2012/0062811 | A1 * | 3/2012 | Miyake .......................... 349/39 |

(Continued)

FOREIGN PATENT DOCUMENTS

| CN | 1538786 A | 10/2004 |
| CN | 101728419 A | 6/2010 |

(Continued)

OTHER PUBLICATIONS

Combined Chinese Office Action and Search Report issued May 6, 2015 in Patent Application No. 201310052585.7 (with English language translation), Dated May 6, 2015.

(Continued)

*Primary Examiner* — Thomas L Dickey
(74) *Attorney, Agent, or Firm* — Oblon, McClelland, Maier & Neustadt, L.L.P.

(57) ABSTRACT

According to one embodiment, a display panel includes a substrate, a switching element, a pixel electrode, an organic light emitting layer, an opposite electrode, a detecting electrode, and an insulating layer. The substrate has a major surface. The switching element is provided on the major surface. The switching element includes a semiconductor layer. The pixel electrode is provided on the major surface. The pixel electrode is electrically connected to the switching element. The organic light emitting layer is provided on the pixel electrode. The opposite electrode is provided on the organic light emitting layer. The detecting electrode is provided between the substrate and at least a part of the pixel electrode. The detecting electrode includes at least one element included in the semiconductor layer. The insulating layer is provided between the pixel electrode and the detecting electrode.

22 Claims, 5 Drawing Sheets

(56) References Cited

U.S. PATENT DOCUMENTS

2012/0120337 A1\* 5/2012 Ji et al. ............................ 349/39
2013/0250225 A1\* 9/2013 Maeda et al. ................. 349/143

FOREIGN PATENT DOCUMENTS

| JP | 2011-54962 | | 3/2011 |
|----|------------|---|--------|
| JP | 2011-102960 | A | 5/2011 |
| JP | 2011/165422 | A | 8/2011 |
| JP | 2011-171288 | A | 9/2011 |
| JP | 2012-004549 | A | 1/2012 |
| JP | 2012-68629 | A | 4/2012 |
| TW | 201102668 | A1 | 1/2011 |
| TW | 201208073 | A1 | 2/2012 |
| TW | 201214818 | A1 | 4/2012 |

OTHER PUBLICATIONS

Combined Taiwanese Office Action and Search Report issued Jun. 3, 2015 in Patent Application No. 102104576 (with English language translation), Dated Jun. 3, 2015.

Office Action issued Dec. 9, 2014 in Japanese Patent Applicaton No. 2012-095914 (with English language translation), Dated Dec. 9, 2014.

Elji Kanda, et al., "Active-matrix sensor in AMLCD detecting liquid-crystal capacitance with LTPS-TFT technology", Journal of the SID 17/2, 2009, 7 pages, Dated 2009.

Office Action issued Jul. 15, 2014 in Japanese Patent Application No. 2012-095914 (with English language translation), Dated Jul. 15, 2014.

\* cited by examiner

DISPLAY PANEL AND DISPLAY DEVICE

CROSS-REFERENCE TO RELATED APPLICATIONS

This application is based upon and claims the benefit of priority from the prior Japanese Patent Application No. 2012-095914, filed on Apr. 19, 2012; the entire contents of which are incorporated herein by reference.

FIELD

Embodiments described herein relate generally to a display panel and a display device.

BACKGROUND

There are an active matrix display panel in which a current passing through an organic EL (Electro-Luminescent) device is controlled by a thin film transistor and a display device using the display panel. In such a display panel and a display device, it is desired to provide a detection function to detect a touch manipulation. In the case of providing the detection function, an aperture ratio is reduced, and image quality is reduced.

DETAILED DESCRIPTION

Figure 1A:
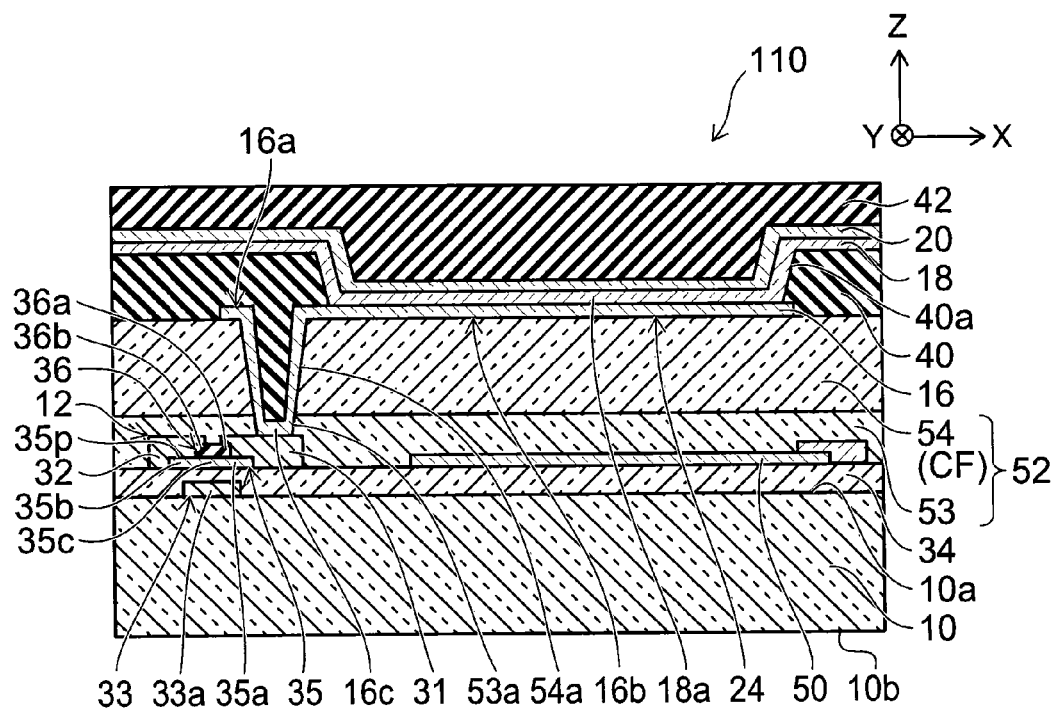
FIG. 1A and FIG. 1B are schematic views illustrating the configuration of a display panel according to a first embodiment.

According to one embodiment, a display panel includes a substrate, a switching element, a pixel electrode, an organic light emitting layer, an opposite electrode, a detecting electrode, and an insulating layer. The substrate has a major surface. The substrate is light transmissive. The switching element is provided on the major surface. The switching element includes a semiconductor layer. The pixel electrode is provided on the major surface. The pixel electrode is electrically connected to the switching element. The pixel electrode is light transmissive. The organic light emitting layer is provided on the pixel electrode. The opposite electrode is provided on the organic light emitting layer. The detecting electrode is provided between the substrate and at least a part of the pixel electrode. The detecting electrode includes at least one element included in the semiconductor layer. The detecting electrode is light transmissive. The insulating layer is provided between the pixel electrode and the detecting electrode. The insulating layer is light transmissive.

According to another embodiment, a display device includes a display panel and a control unit. The display panel includes a substrate, a switching element, a pixel electrode, an organic light emitting layer, an opposite electrode, a detecting electrode, and an insulating layer. The substrate has a major surface. The substrate is light transmissive. The switching element is provided on the major surface. The switching element includes a semiconductor layer. The pixel electrode is provided on the major surface. The pixel electrode is electrically connected to the switching element. The pixel electrode is light transmissive. The organic light emitting layer is provided on the pixel electrode. The opposite electrode is provided on the organic light emitting layer. The detecting electrode is provided between the substrate and at least a part of the pixel electrode. The detecting electrode includes at least one element included in the semiconductor layer. The detecting electrode is light transmissive. The insulating layer is provided between the pixel electrode and the detecting electrode. The insulating layer is light transmissive. The control unit is configured to control an operation of the switching element to control a light emitted from the organic light emitting layer. The control unit is configured to detect a capacitance of a detecting capacitor formed of the pixel electrode, the detecting electrode, and the insulating film.

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or illustrated in a drawing thereinabove are marked with the identical reference numerals, and a detailed description is omitted as appropriate.

First Embodiment

Figure 1B:
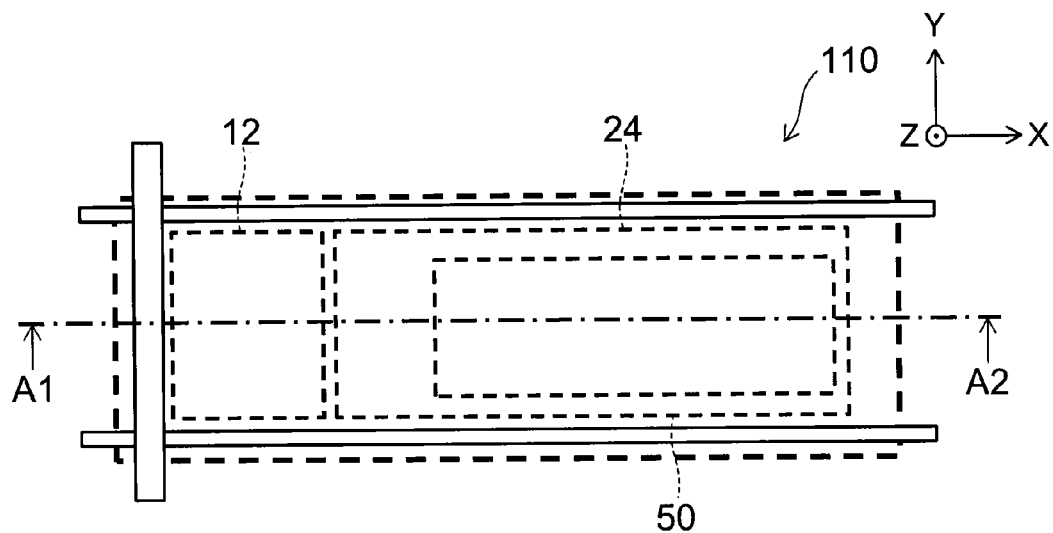

FIG. 1A and FIG. 1B are schematic views illustrating the configuration of a display panel according to a first embodiment.

FIG. 1A is a schematic cross-sectional view. FIG. 1B is a schematic plan view. FIG. 1A schematically shows a cross section on line A1-A2 in FIG. 1B.

As shown in FIG. 1A and FIG. 1B, a display panel 110 according to the embodiment includes a substrate 10, a switching element 12, a pixel electrode 16, an organic light emitting layer 18, an opposite electrode 20, a detecting electrode 50, and an insulating layer 52.

The pixel electrode 16, the organic light emitting layer 18, and the opposite electrode 20 form an organic EL light emitting element portion 24. The light emission of the light emitting element portion 24 is controlled and driven by the switching element 12. In the display panel 110, the combinations of the switching elements 12 and the light emitting element portions 24 are disposed in a matrix configuration. In the display panel 110, the drive of the switching elements 12 and the light emission of the light emitting element portions 24 in association with the drive are controlled to display pictures. The display panel 110 is an active matrix display panel using an organic EL device.

Figure 2:
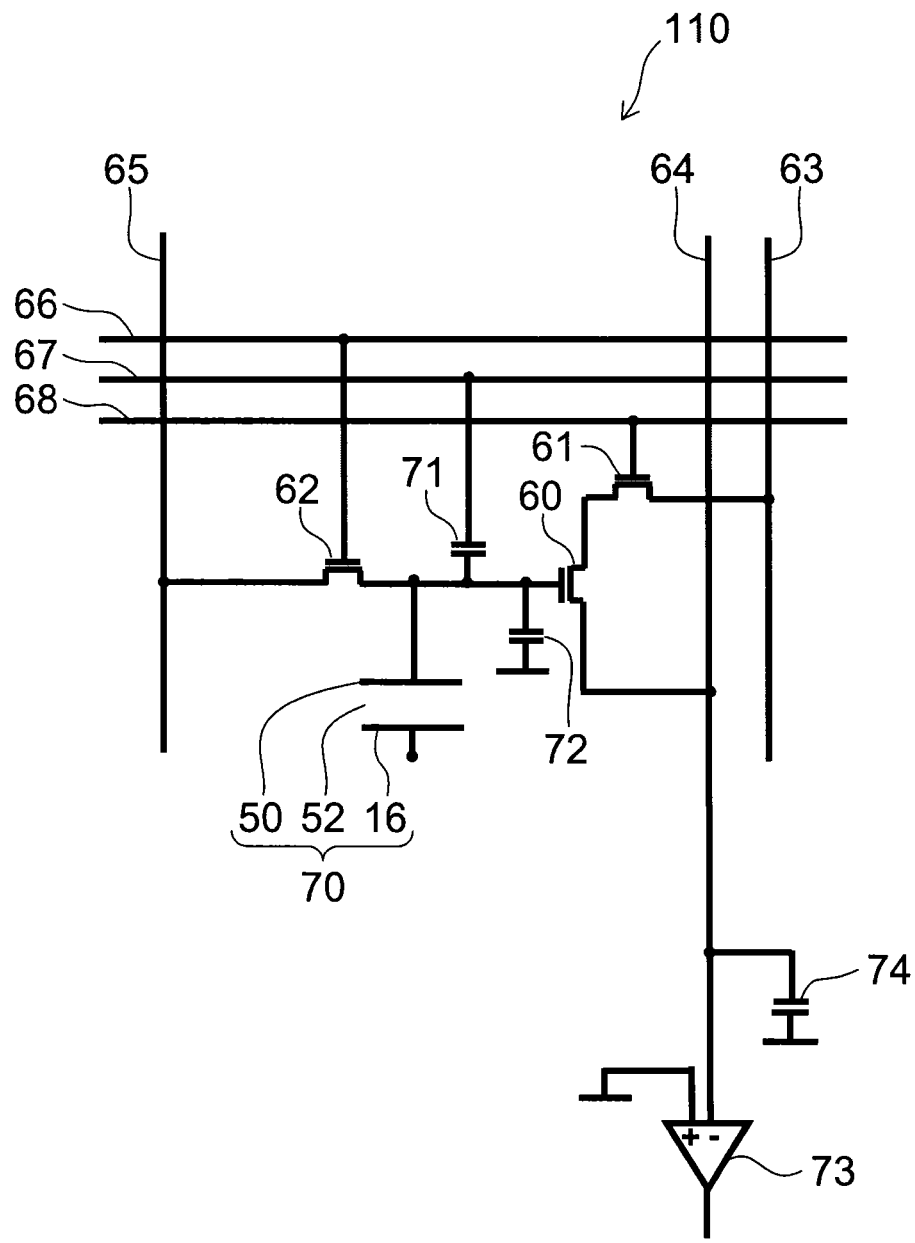
FIG. 2 is an equivalent circuit diagram illustrating the configuration of the display panel according to the first embodiment.

The pixel electrode 16, the detecting electrode 50, and the insulating layer 52 form a detecting capacitor 70 that detects the presence or absence of a subject to be detected, which is coming close to the detecting electrode 50 (see FIG. 2). In the detection of the subject to be detected by the detecting capacitor 70, a so-called touch manipulation is implemented in which a manipulation instruction is inputted to the display panel 110 by touching a screen with a finger, a dedicated pen, or the like, for example. Namely, the display panel 110 is a display panel equipped with a detection function to detect a touch manipulation (a touch panel display).

The substrate 10 has a first major surface (a major surface) 10a and a second major surface 10b opposite the first major surface 10a. The substrate 10 is light transmissive, for example. In the specification, a light transmissive component means that light emitted from the light emitting element portion 24 can be transmitted through the component. The substrate 10 is transparent, for example. A resin material such as a polyimide resin and an aramid resin, for example, is used for the substrate 10. Thus, a flexible display panel 110 can be implemented. A material used for the substrate 10 may be an inflexible material such as a glass material and a hard resin material. Preferably, the thickness of the substrate 10 is thinner, 0.5 mm or less, for example.

A barrier layer that suppresses the penetration of impurities, moisture, or the like, for example, may be provided on the first major surface 10a of the substrate 10. A silicon oxide film, a silicon nitride film, silicon oxynitride film, or the like, for example, is used for the barrier layer. Thereby, the switching element 12 and the light emitting element portion 24 provided on the substrate 10 can be protected from impurities, moisture, or the like, for example.

Here, suppose that a first direction perpendicular to the first major surface 10a is a Z-axis direction. A direction perpendicular to the Z-axis direction is taken as an X-axis direction. A direction perpendicular to the Z-axis direction and the X-axis direction is taken as a Y-axis direction.

The switching element 12 is provided on the major surface 10a of the substrate 10.

The switching element 12 includes a first conducting portion 31, a second conducting portion 32, a gate electrode 33, a gate insulating film 34, a semiconductor layer 35, and a channel protection film 36.

The gate electrode 33 is provided on the major surface 10a of the substrate 10. A high melting point metal such as molybdenum tungsten (MoW), molybdenum tantalum (MoTa), and tungsten (W), for example, is used for the gate electrode 33. An Al alloy having a principal component of Al in which an anti-hillock configuration is provided may be used for the gate electrode 33, for example. A stacked body of Al and a high melting point metal may be used for the gate electrode 33, for example.

The gate insulating film 34 is provided on the gate electrode 33. In this example, the gate insulating film 34 is provided on throughout the major surface 10a so as to cover the gate electrode 33. An insulative and light transmissive material, for example, is used for the gate insulating film 34. A silicon oxide film, a silicon nitride film, a silicon oxynitride film, or the like can be used for the gate insulating film 34, for example. The gate insulating film 34 may be a stacked body including at least one of a silicon oxide film, a silicon nitride film, and a silicon oxynitride film, for example.

The semiconductor layer 35 is provided on the gate insulating film 34. The gate insulating film 34 is provided between the gate electrode 33 and the semiconductor layer 35, and insulates the gate electrode 33 from the semiconductor layer 35. An amorphous oxide semiconductor including at least one of In, Ga, and Zn is used for the semiconductor layer 35, for example. Namely, one of an In—Ga—Zn—O oxide semiconductor, an In—Ga—O oxide semiconductor, and an In—Zn—O oxide semiconductor is used for the semiconductor layer 35, for example. The thickness of the semiconductor layer 35 (a length along the Z-axis direction) is about 50 nm, for example. Thus, the electric characteristics of the semiconductor layer 35 are made excellent. More specifically, the thickness of the semiconductor layer 35 is 10 nm or more and 100 nm or less, for example. The material of the semiconductor layer 35 may be a given material that is a light transmissive material and can control the light emission of the light emitting element portion 24, for example.

In the semiconductor layer 35 including an amorphous oxide semiconductor, a diffraction pattern or the like showing crystallinity is not observed even though the semiconductor layer 35 is observed using a transmission electron microscope (TEM) or X-ray diffraction (XRD) topography, for example. The film and shape of the semiconductor layer 35 can be observed using a scanning electron microscope (SEM), TEM, or the like.

For the semiconductor layer 35, such a material may be used that the microcrystals of the oxide semiconductor are dispersed in the amorphous oxide semiconductor described above.

The first conducting portion 31 is electrically connected to the semiconductor layer 35. The second conducting portion 32 is electrically connected to the semiconductor layer 35. Ti, Al, Mo, and the like, for example, are used for the first conducting portion 31 and the second conducting portion 32. The first conducting portion 31 and the second conducting portion 32 may be a stacked body including at least one of Ti, Al and Mo, for example. The first conducting portion 31 is one of the source electrode and drain electrode of the switching element 12. The second conducting portion 32 is the other of the source electrode and drain electrode of the switching element 12.

The channel protection film 36 is provided on the semiconductor layer 35. The channel protection film 36 protects the semiconductor layer 35. An insulative material is used for the channel protection film 36. A silicon oxide film, for example, is used for the channel protection film 36. In the case where an amorphous oxide semiconductor is used for the semiconductor layer 35, a silicon oxide film with acid resistance higher than the acid resistance of the semiconductor layer 35 is used for the channel protection film 36, for example. The channel protection film 36 may be a silicon nitride film or a silicon oxynitride film, for example.

The first conducting portion 31 covers a first portion 36a of the channel protection film 36. The second conducting portion 32 covers a second portion 36b of the channel protection film 36. The first conducting portion 31 covers a first region 35a of the semiconductor layer 35. The second conducting portion 32 covers a second region 35b of the semiconductor layer 35. The second region 35b is apart from the first region 53a in a direction parallel to the first major surface 10a. The second conducting portion 32 is disposed apart from the first conducting portion 31. The semiconductor layer 35 has a third region 35c which is provided between the first region 35a and the second region 35b. The third region 35c is not covered with the first conducting portion 31 and the second conducting portion 32. The gate electrode 33 has a portion 33a between the first conducting portion 31 and the second conducting portion 32 when seen in a direction perpendicular to a film surface 35p of the semiconductor layer 35 (in the Z-axis direction). The gate electrode 33 opposes the third region 35c of the semiconductor layer 35 via the gate insulating film 34. The gate insulating film 34 is disposed between the gate electrode 33 and the third region 35c. The channel protection film 36 is provided at least on the third region 35c.

A voltage is applied to the gate electrode 33 to generate a channel through the semiconductor layer 35, and a current passes across the first conducting portion 31 and the second conducting portion 32. In this example, the switching element 12 is a bottom gate thin film transistor. The switching element 12 is not limited to a bottom gate thin film transistor. The switching element 12 may be a top gate thin film transistor, for example. The switching element 12 may be a transistor in other structures or the like. In the bottom gate structure, the gate electrode 33 can suppress a malfunction caused by external light incident to the semiconductor layer 35.

The detecting electrode 50 is provided between at least a part of the pixel electrode 16 and the substrate 10. In this example, the detecting electrode 50 is provided on the gate insulating film 34. The detecting electrode 50 is provided on the same surface as the semiconductor layer 35 is located. A difference between a distance between the detecting electrode 50 and the substrate 10 along the Z-axis direction and a distance between the detecting electrode 50 and the substrate 10 along the Z-axis direction is 10 nm or less. A distance between the detecting electrode 50 and the substrate 10 along the Z-axis direction is substantially the same as a distance between the semiconductor layer 35 and the substrate 10 along the Z-axis direction.

The detecting electrode 50 is light transmissive. The detecting electrode 50 is transparent, for example. The detecting electrode 50 includes at least one element included in the semiconductor layer 35. In this example, the detecting electrode 50 includes at least one of In, Ga, and Zn. An amorphous oxide semiconductor is used for the detecting electrode 50. One of an In—Ga—Zn—O oxide semiconductor, an In—Ga—O oxide semiconductor, and an In—Zn—O oxide semiconductor is used for the detecting electrode 50, for example. A material substantially the same as the material of the semiconductor layer 35 is used for the detecting electrode 50. The detecting electrode 50 is formed in the same process steps as the semiconductor layer 35, for example.

The insulating layer 52 is provided between the pixel electrode 16 and the detecting electrode 50. The insulating layer 52 is light transmissive. The insulating layer 52 is transparent, for example. In this example, the insulating layer 52 is provided on throughout the first major surface 10a, and covers the detecting electrode 50 and the switching element 12. The insulating layer 52 includes a contact layer 53 and an organic layer 54. The insulating layer 52 may include one of the contact layer 53 and the organic layer 54. The insulating layer 52 may further include another light transmissive and insulative layer.

The contact layer 53 is provided as contacting the detecting electrode 50. The contact layer 53 includes at least one of a silicon oxide film, a silicon oxynitride film, and a silicon nitride film, for example. The thickness of the contact layer 53 along the Z-axis direction (the length along the Z-axis direction) is 100 nm or more and 200 nm or less, for example. The contact layer 53 is formed by CVD (Chemical Vapor Deposition), for example.

The concentration of hydrogen included in the contact layer 53 is $1\times10^{19}$ atoms/cm$^3$ or more, for example. The contact layer 53 having the hydrogen concentration can be implemented by increasing the ratio of a silane flow rate in forming the contact layer 53 by CVD, for example. Thereby, hydrogen included in the contact layer 53 can be moved in the detecting electrode 50 and the resistance of the detecting electrode 50 including an amorphous oxide semiconductor can be decreased.

On the other hand, the channel protection film 36 is provided on the semiconductor layer 35 including the same amorphous oxide semiconductor, and the channel protection film 36 suppresses the penetration of hydrogen. Thereby, a reduction in the resistance of the semiconductor layer 35 can be suppressed. Namely, it is suppressed that the switching element 12 is turned into the normally on state.

The organic layer 54 is a color filter CF, for example. The color filter CF has a different color for every pixel. The color filter CF includes one of red, green, and blue colors, for example. In the display panel 110, the color filter CF having one of red, green, and blue colors, for example, is individually disposed in a predetermined pattern for the pixels. Thereby the display of full color pictures can be enabled in the display panel 110. A color resin film (a color resist, for example) is used for the color filter CF, for example. The color filter CF is light transmissive. The transmittance of the color filter CF is varied depending on wavelengths.

The thickness of the organic layer 54 (the color filter CF) along the Z-axis direction is 1 μm or more 10 μm or less, for example, more specifically, 2 μm or more. Therefore, since the parasitic capacitance generated between the detecting electrode 50 and the opposite electrode 20 can be reduced, the sensitivity of detecting a touch manipulation can be improved. The organic layer 54 may be a silicone resin or the like, for example. The organic layer 54 may be a material that is light transmissive to the light emitted from the light emitting element portion 24 and can provide the thickness recited above.

The pixel electrode 16 is electrically connected to one of the first conducting portion 31 and the second conducting portion 32. In this example, the pixel electrode 16 is electrically connected to the first conducting portion 31 (a source, for example). The pixel electrode 16 is provided on the first major surface 10a. In this example, the pixel electrode 16 is provided on the insulating layer 52. The pixel electrode 16 has an opposing region 16a opposing the switching element 12 and a non-opposing region 16b not opposing the switching element 12 in the Z-axis direction. The pixel electrode 16 overlaps with the detecting electrode 50 in the non-opposing region 16b when projected onto the first major surface 10a (an X-Y plane).

An electrically conductive and light transmissive material, for example, is used for the pixel electrode 16. ITO (Indium Tin Oxide), an ITO/Ag/ITO stacked structure, AZO that is ZnO doped with Al, or the like is used for the pixel electrode 16, for example.

The contact layer 53 and the organic layer 54 are provided with an opening 53a and an opening 54a, respectively. A part of the first conducting portion 31 is exposed from the opening 53a and the opening 54a. A part 16c of the opposing region 16a of the pixel electrode 16 contacts the first conducting portion 31 in the opening 53a and the opening 54a. Thus, the pixel electrode 16 is electrically connected to the first conducting portion 31.

A bank layer 40 is provided on the pixel electrode 16 and the organic layer 54. An insulative and light transmissive material, for example, is used for the bank layer 40. The bank layer 40 is transparent, for example. An organic resin material, for example, is used for the bank layer 40. A photosensitive acrylic resin, a photosensitive polyimide, or the like, for example, is used for the bank layer 40. The bank layer 40 has an opening 40a. A part of the non-opposing region 16b of the pixel electrode 16 is exposed from the opening 40a.

The organic light emitting layer 18 is provided on the bank layer 40. A part 18a of the organic light emitting layer 18 enters the opening 40a. The organic light emitting layer 18 contacts the non-opposing region 16b of the pixel electrode 16 in the opening 40a. The organic light emitting layer 18 is electrically connected to the pixel electrode 16 in the opening 40a, for example. The bank layer 40 prevents the opposing region 16a from contacting the organic light emitting layer 18. A stacked body having a hole transport layer, a light emitting layer, and an electron transport layer stacked on each other, for example, is used for the organic light emitting layer 18. The organic light emitting layer 18 is light transmissive. The organic light emitting layer 18 is transparent, for example.

The opposite electrode 20 is provided on the organic light emitting layer 18. A conductive material is used for the opposite electrode 20. A metal film such as Al and MgAg is used for the opposite electrode 20, for example. The thickness of the opposite electrode 20 is 5 nm or more 500 nm or less, for example. In this example, the pixel electrode 16 is served as an anode and the opposite electrode 20 is served as a cathode. The pixel electrode 16 may be served as a cathode and the opposite electrode 20 may be served as an anode.

The light emitting element portion 24 is formed in the non-opposing region 16b, for example. In the light emitting element portion 24, a voltage is applied across the pixel electrode 16 and the opposite electrode 20 to emit light from the organic light emitting layer 18. The light emitted from the organic light emitting layer 18 passes through the insulating layer 52, the detecting electrode 50, the gate insulating film 34, and the substrate 10, and goes to the outside. The display panel 110 is a lower surface emitting display panel. In the display panel 110, the second major surface 10b is a display surface on which pictures are displayed. In the display panel 110, the subject to be detected coming close to the second major surface 10b is detected, for example.

A sealing layer 42 is provided on the opposite electrode 20. The sealing layer 42 suppresses the penetration of impurities, moisture, or the like, for example. The sealing layer 42 protects the switching element 12, the light emitting element portion 24, or the like from moisture or the like, for example. An insulative material is used for the sealing layer 42. A silicon oxide film, a silicon oxynitride film, a silicon nitride film, alumina, a tantalum oxide film, or the like is used for the sealing layer 42, for example.

FIG. 2 is an equivalent circuit diagram illustrating the configuration of the display panel according to the first embodiment.

FIG. 2 schematically illustrates an equivalent circuit diagram of the touch detection function of the display panel 110.

As shown in FIG. 2, the display panel 110 further includes an amplifier transistor 60, a select transistor 61, a reset transistor 62, a power supply line 63, an output signal line 64, a reset power supply line 65, a reset signal line 66, a read signal line 67, and a select signal line 68.

The gate of the amplifier transistor 60 is electrically connected to the source of the reset transistor 62. The drain of the amplifier transistor 60 is electrically connected to the source of the select transistor 61. The source of the amplifier transistor 60 is electrically connected to the read signal line 64.

The gate of the select transistor 61 is electrically connected to the select signal line 68. The drain of the select transistor 61 is electrically connected to the power supply line 63. The gate of the reset transistor 62 is electrically connected to the reset signal line 66. The drain of the reset transistor 62 is electrically connected to the reset power supply line 65.

The power supply line 63 supplies a predetermined supply voltage (a voltage of +5 V, for example) to the drain of the select transistor 61. The reset power supply line 65 supplies a predetermined voltage to the drain of the reset transistor 62.

The detecting capacitor 70 is electrically connected to the gate of the amplifier transistor 60. The detecting capacitor 70 is formed of the pixel electrode 16, the detecting electrode 50, and the insulating layer 52, as described above. The capacitance of the detecting capacitor 70 is varied depending on the presence or absence of the subject to be detected coming close to the detecting electrode 50 (the second major surface 10b).

A read capacitor 71 and a parasitic capacitance 72 are electrically connected to the gate of the amplifier transistor 60. The other end of the read capacitor 71 is electrically connected to the read signal line 67. The parasitic capacitance 72 is a floating capacitance that appears in association with the formation of the detecting electrode 50 or the like, for example. The parasitic capacitance 72 is increased according to the area that the pixel electrode 16 overlaps with the detecting electrode 50, for example.

In the case where a touch manipulation is detected in the display panel 110, first, a reset pulse is inputted to the reset signal line 66 to turn the reset transistor 62 into the ON state. When the reset transistor 62 is turned into the ON state, the gate potential of the amplifier transistor 60 is set to a predetermined reference potential supplied from the reset power supply line 65.

After setting the gate potential of the amplifier transistor 60 to the reference potential, the reset transistor 62 is turned into the OFF state. Thus, the gate of the amplifier transistor 60 is turned into an electrical floating state.

After turning the reset transistor 62 into the OFF state, a select pulse is inputted to the select signal line 68 to turn the select transistor 61 into the ON state, and a read pulse is inputted to the read signal line 67. When the read pulse is inputted, the capacitance of the read capacitor 71 is set to a value corresponding to the read pulse. Thus, a potential corresponding to the capacitance of the detecting capacitor 70, the capacitance of the read capacitor 71, the capacitance of the parasitic capacitance 72, and the potential of the read pulse is set to the gate of the amplifier transistor 60. A current corresponding to the gate potential passes across the drain and the source of the amplifier transistor 60.

The gate potential of the amplifier transistor 60 when the read pulse is inputted is expressed by Equation (1). In Equation (1), $\Delta Vp$ is the gate potential of the amplifier transistor 60. Ct is the capacitance of the detecting capacitor 70. Cc is the capacitance of the read capacitor 71. Cp is the parasitic capacitance 72 corresponding to the overlap between the detecting electrode 50 and the pixel electrode 16. C0 is the parasitic capacitance of the detecting electrode 50 not depending on the overlap with the pixel electrode 16. k is a proportionality constant. $\Delta Vc$ is the voltage amplitude of the read pulse.

$$\Delta Vp = \frac{Cc}{Cc + C0 + k \times (Cp + Ct)} \times \Delta Vc \quad (1)$$

As shown in Equation (1), the gate potential of the amplifier transistor 60 is set according to a capacitance ratio between the capacitance of the detecting capacitor 70, the capacitance of the read capacitor 71, and the capacitance of the parasitic capacitance 72. Thus, the gate potential of the amplifier transistor 60 is varied depending on the capacitance of the detecting capacitor 70. A current passing across the drain and the source of the amplifier transistor 60 is varied depending on the capacitance of the detecting capacitor 70. The capacitance of the detecting capacitor 70 can be detected by the current passing across the drain and the source of the amplifier transistor 60. Namely, the presence or absence of the subject to be detected can be detected. Thereby, the function of detecting a touch manipulation can be implemented.

The read signal line 64 is electrically connected to the inverting input terminal of the comparator 73. An output capacitor 74 is electrically connected to the read signal line 64 between the amplifier transistor 60 and the comparator 73. Thus, a voltage (in the following, referred to as a detection voltage) corresponding to the current passing across the drain and the source of the amplifier transistor 60 is applied to the inverting input terminal of the comparator 73.

A predetermined threshold voltage is applied to the non-inverting input terminal of the comparator 73. Consequently, "High" is outputted to the output terminal of the comparator 73 in the case where the detection voltage is the threshold voltage or less, whereas "Low" is outputted in the case where the detection voltage is the threshold voltage or more. Thereby, the determination that the subject to be detected is not detected can be enabled in the case where the output of the comparator 73 is "High". It can be determined that the subject to be detected is detected in the case where the output of the comparator 73 is "Low".

Figure 3:
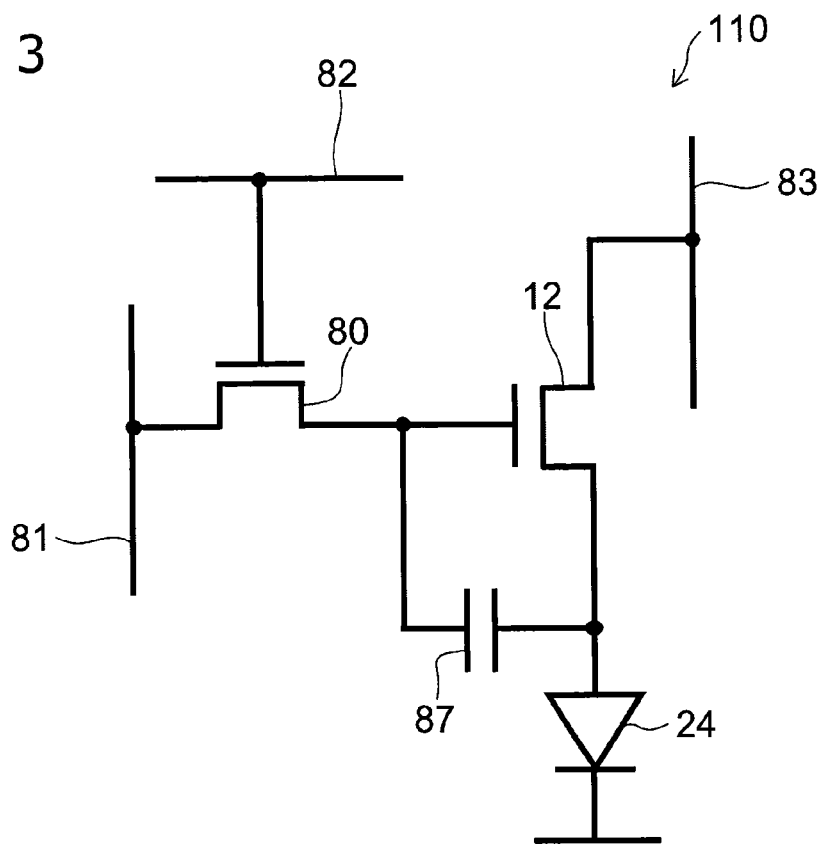
FIG. 3 is an equivalent circuit diagram illustrating the configuration of the display panel according to the first embodiment.

FIG. 3 is an equivalent circuit diagram illustrating the configuration of the display panel according to the first embodiment.

FIG. 3 schematically shows an equivalent circuit diagram of the light emitting function that emits light from the light emitting element portion 24 of the display panel 110.

As shown in FIG. 3, the display panel 110 further includes a switch transistor 80, a video signal line 81, a gate line 82, a power supply line 83, and a capacitor 87.

The source (the first conducting portion 31) of the switching element 12 is electrically connected to the anode (the pixel electrode 16) of the light emitting element portion 24. The drain (the second conducting portion 32) of the switching element 12 is electrically connected to the power supply line 83 that supplies a supply voltage. The gate (the gate electrode 33) of the switching element 12 is electrically connected to the source of the switch transistor 80.

The cathode (the opposite electrode 20) of the light emitting element portion 24 is electrically connected to a common power supply (a ground, for example). The drain of the switch transistor 80 is electrically connected to the signal line 81. The gate of the switch transistor 80 is electrically connected to the gate line 82.

One end of the capacitor 87 is electrically connected to the gate of the switching element 12 and the source of the switch transistor 80. The other end of the capacitor 87 is electrically connected to the source of the switching element 12 and the anode of the light emitting element portion 24.

In the display panel 110, in the case where light is emitted from light emitting element portion 24, first, a voltage is applied to the gate line 82 to turn the switch transistor 80 into the ON state, a voltage corresponding to a predetermined video signal (in the following, referred to as a video signal pulse) is applied to the video signal line 81, and the voltage is applied to the gate of the switching element 12 and the capacitor 87 through the video signal line 81 and the switch transistor 80 in the ON state. Thus, electric charges corresponding to the voltage of the video signal line 81 are accumulated in the capacitor 87.

After accumulating electric charges in the capacitor 87, the switch transistor 80 is switched to the OFF state. When the switch transistor 80 is switched to the OFF state, a voltage corresponding to the electric charges accumulated in the capacitor 87 is applied to the gate of the switching element 12. Thus, a current corresponding to the voltage of the gate of the switch transistor 80 passes through the light emitting element portion 24. Light is emitted from the organic light emitting layer 18 of the light emitting element portion 24 at the luminance corresponding to the current.

In the organic EL display panel equipped with the touch detection function, there is a configuration in which the light emitting element portion 24 and the detecting electrode 50 are disposed side by side. In this configuration, in the case where the areas of the pixels are the same, the area of the light emitting element portion 24 is smaller than in a display panel without the detection function, causing the deterioration of image quality. When the area of the light emitting element portion 24 is smaller in the organic EL display panel, EL lifetime is also shortened.

On the contrary, in the display panel 110 according to the embodiment, the detecting electrode 50 overlaps with the light emitting element portion 24 when projected onto the first major surface 10a (the X-Y plane). Thereby, a reduction in the area of the light emitting element portion 24 and the deterioration of image quality associated with the reduction in the area can be suppressed also in the case of providing the detection function.

In the display panel 110 according to the embodiment, the semiconductor layer 35 and the detecting electrode 50 are made of the same amorphous oxide semiconductor. Therefore, the semiconductor layer 35 and the detecting electrode 50 can be formed in the same process step in the display panel 110, for example. Thereby, the simplification of the manufacturing process steps of the display panel 110 can be enabled, for example.

Figure 4:
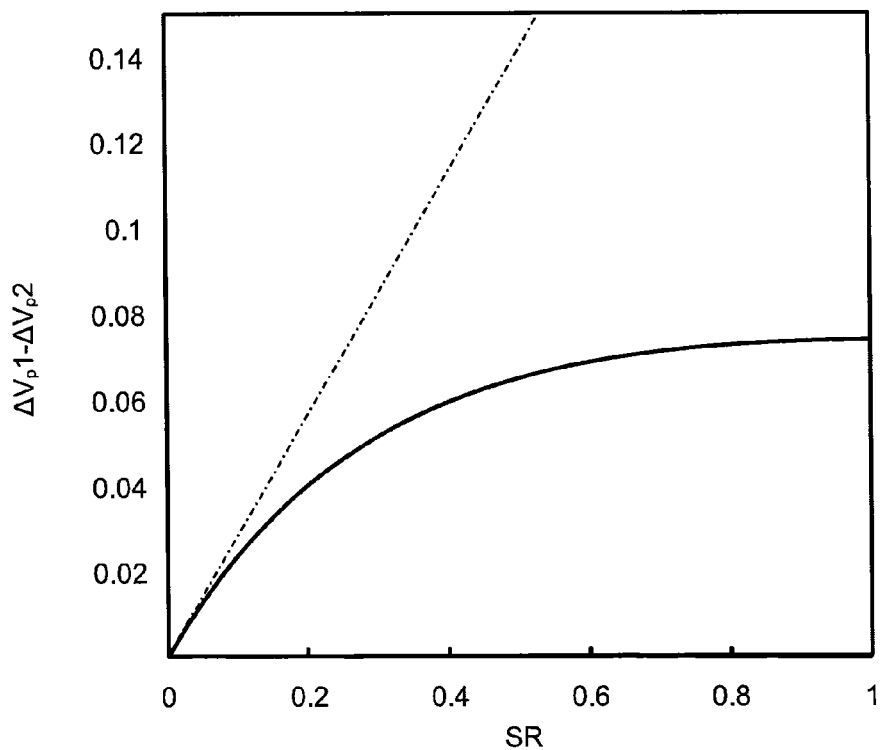
FIG. 4 is a graph illustrating the characteristics of the display panel according to the first embodiment.

FIG. 4 is a graph illustrating the characteristics of the display panel according to the first embodiment.

The horizontal axis in FIG. 4 represents a ratio SR of the area of the detecting electrode 50 to the area of the pixel. The vertical axis represents a difference $\Delta Vp1 - \times Vp2$ between a gate potential $\Delta Vp1$ of the amplifier transistor 60 in the state in which the subject to be detected is not detected and a gate potential $\Delta Vp2$ of the amplifier transistor 60 in the state in which the subject to be detected is detected.

When SR=0, such a state is expressed in which the detecting electrode 50 is not provided. When SR=0.5, such a state is expressed in which the detecting electrode 50 in the area a half of the area of the pixel is provided. When SR=1, such a state is expressed in which the detecting electrode 50 in the area the same as the area of the pixel is provided. Namely, the difference $\Delta Vp1 - \Delta Vp2$ is the sensitivity to detect the subject to be detected. The higher the difference $\Delta Vp1 - \Delta Vp2$ is, the higher detection sensitivity is.

In FIG. 4, a solid line expresses the characteristics of the display panel 110 according to the embodiment. An alternate long and short dash line expresses the characteristics of a display panel according to a reference sample in which the light emitting element portion 24 and the detecting electrode 50 are disposed side by side. In the configuration of the reference sample, since the light emitting element portion 24 and the detecting electrode 50 are disposed side by side, it is difficult to form the detecting electrode 50 in the area the same as the area of the pixel. In the display panel 110, since the light emitting element portion 24 and the detecting electrode 50 are disposed as they overlap with each other, the detecting electrode 50 in the area the same as the area of the pixel can also be formed.

As shown in FIG. 4, the sensitivity of the display panel 110 does not exceed a certain value or more, even though the area of the detecting electrode 50 is increased. It can be considered that this is because the capacitance Cp of the parasitic capacitance 72 connected to the gate of the amplifier transistor 60 is increased as the area of the detecting electrode 50 is increased and the area of the light emitting element portion 24 overlapping with the detecting electrode 50 is increased (see Equation (1) recited above).

However, in the display panel 110, there is no reduction in the area of the light emitting element portion 24 caused by the detecting electrode 50 (there is no reduction in the aperture ratio). For example, in the display panel 110, the sensitivity in the case where the area of the detecting electrode 50 is 100% is substantially the same as the sensitivity in the case where the area of the detecting electrode 50 is about 20% in the configuration of the reference sample, that is, the sensitivity in the case where the area of the light emitting element portion 24 is reduced by about 20%. For example, the transmittance of a capacitive touch panel equipped later is about 90%. Consequently, in order to suppress a reduction in the area of the light emitting element portion 24 to almost the same as the transmittance in the case where the touch panel is equipped later, it is necessary that a reduction in the area of the light emitting element portion 24 be 10% or less. Therefore, it can be considered that securing sensitivity by the configuration of the display panel 110 is practically effective.

Second Embodiment

Figure 5:
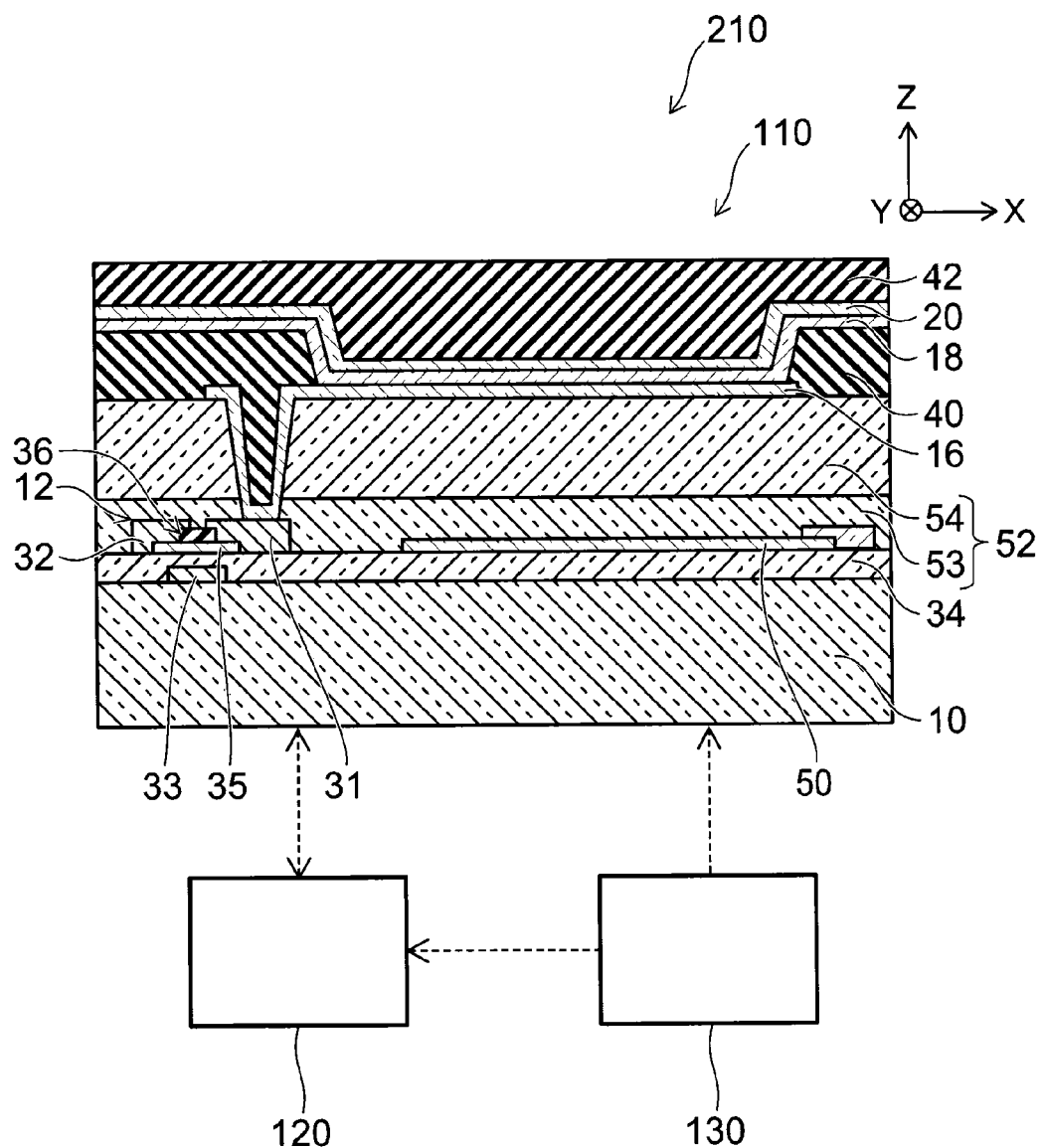
FIG. 5 is a schematic view illustrating the configuration of a display device according to a second embodiment.

FIG. 5 is a schematic view illustrating the configuration of a display device according to a second embodiment.

As shown in FIG. 5, the display device 210 includes a display panel 110, a control unit 120, and a power supply unit 130.

The control unit 120 is electrically connected to the display panel 110 to control the operation of a switching element 12 and to detect the capacitance of a detecting capacitor 70. Namely, the control unit 120 controls the light emission of a light emitting element portion 24 and controls the detection of a touch manipulation.

The control unit 120 is electrically connected to an output signal line 64, a reset signal line 66, a read signal line 67, and a select signal line 68, for example. The control unit 120 inputs various signals to the reset signal line 66, the read signal line 67, and the select signal line 68, and receives a signal outputted from the output signal line 64 to control the detection of a touch manipulation.

The control unit 120 is electrically connected to a video signal line 81 and a gate line 82, for example. The control unit 120 inputs various signals to the video signal line 81 and the gate line 82 to control the light emission of the light emitting element portion 24, for example.

The control unit 120 receives a video signal through a cable and a storage medium and in a wireless manner, for example. The control unit 120 controls the light emission of the light emitting element portions 24 included in the display panel 110 corresponding to the inputted video signal. Thus, the control unit 120 displays a picture corresponding to the inputted video signal on the display panel 110.

The power supply unit 130 is electrically connected to the display panel 110 and the control unit 120. The power supply unit 130 supplies necessary power to the display panel 110 and the control unit 120. The power supply unit 130 is electrically connected to the power supply line 63, the reset power supply line 65, and the power supply line 83, for example. The power supply unit 130 supplies a supply voltage to the power supply line 63 and the power supply line 83, for example. The power supply unit 130 supplies a predetermined reset power to the reset power supply line 65, for example.

Figure 6:
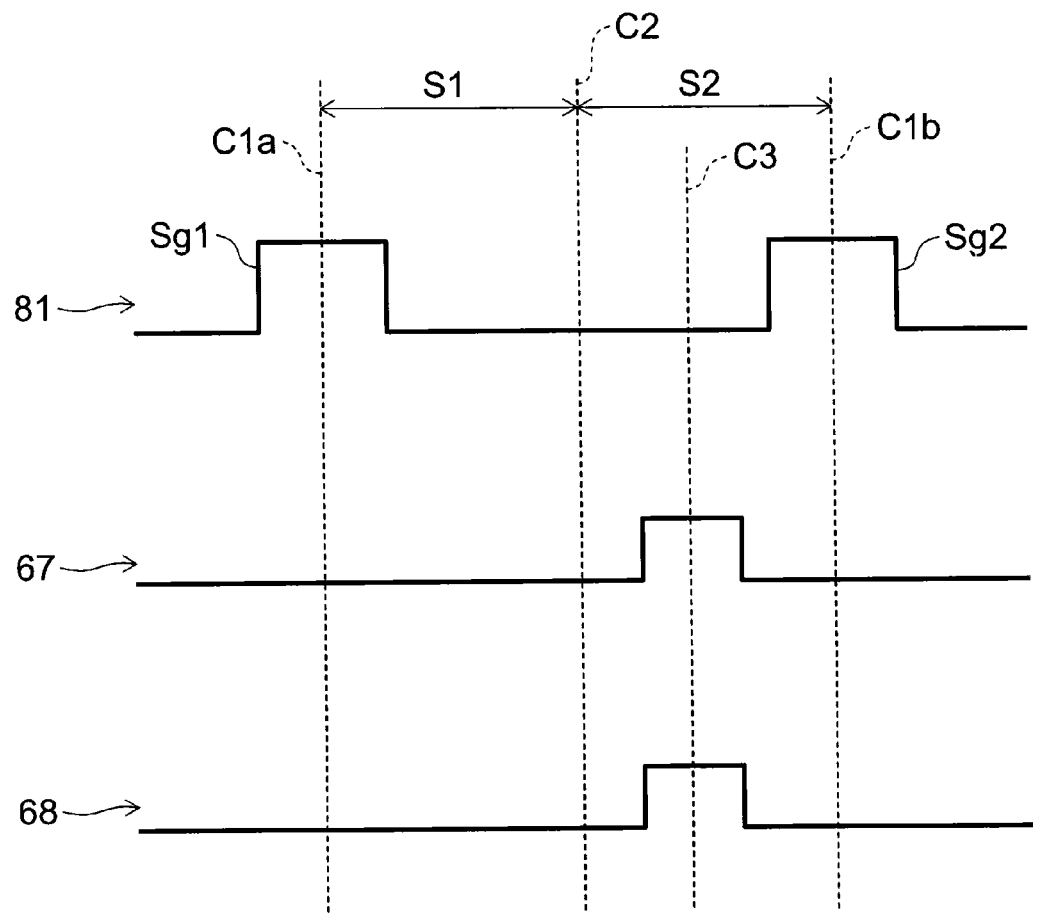
FIG. 6 is a timing chart illustrating a part of the control of the display device according to the second embodiment.

FIG. 6 is a timing chart illustrating a part of the control of the display device according to the second embodiment.

As shown in FIG. 6, the control unit 120 inputs a video signal pulse, which is a signal to emit light from an organic light emitting layer 18 of the light emitting element portion 24 at a predetermined luminance, to the gate of the switching element 12, subsequent to the detection of the capacitance of the detecting capacitor 70. The control unit 120 detects the capacitance of the detecting capacitor 70 immediately before inputting the video signal pulse.

Suppose that the center position on the time base of a single video signal pulse (a first signal Sg1) is C1$a$ (a first timing). The center position on the time base of the subsequent video signal pulse (a second signal Sg1) is C1$b$ (a second timing). The center position on the time base between the center position C1$a$ and the center position C1$b$ is C2. An interval between the center position C1$a$ and the center position C2 is a first interval S1. An interval between the center position C2 and the center position C1$b$ is a second interval S2 (a latter period). The center position of the read pulse inputted to the read signal line 67 and the center position on the time base of the select pulse inputted to the select signal line 68 are C3. The control unit 120 positions the center position C3 on the second interval S2. That is, the detecting is performed in the latter period (the second interval S2).

Therefore, it can be suppressed that the capacitance generated in the detecting capacitor 70 due to the approach of the subject to be detected adversely affects electric charges accumulated in the capacitor 87. The signal to emit light from the organic light emitting layer 18 is not limited to the video signal pulse inputted to the video signal line 81. The signal to emit light from the organic light emitting layer 18 may be a given signal to be inputted to the switching element 12 for light emission.

According to the embodiments, a high-quality display panel having a detection function and a display device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification of the application, a state in which "a component is provided on another component" includes a state in which a component is directly provided on another component as well as a state in which a component is provided on another component with a different element inserted between the component and another component. A state in which "a component is stacked on another component" includes a state in which a component is stacked on another component to contact each other as well as a state in which a component is stacked on another component with a different element inserted between the component and another component. A state in which "a component opposes another component" includes a state in which a component directly faces another component as well as a state in which a component faces another component with a different element inserted between the component and another component.

As described above, the embodiments of the invention are described with reference to specific examples.

However, the embodiments of the invention are not limited to these specific examples. For example, the specific configurations of the components such as the substrate, the switching element, the pixel electrode, the organic light emitting layer, the opposite electrode, the detecting electrode, the insulating layer, the organic layer, the contact layer and the control unit included in the display panel and the display device are incorporated in the scope of the invention as long as a person skilled in the art appropriately selects components from the publicly known range to similarly implement the invention for obtaining the similar effect.

Further, any two or more components of the specific examples may be combined within the extent of technical feasibility and are included in the scope of the invention to the extent that the purport of the invention is included.

Moreover, all display panels, and display devices practicable by an appropriate design modification by one skilled in the art based on the display panel, and display device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display panel comprising:
   a substrate having a major surface, the substrate being light transmissive;
   a switching element provided on the major surface and including a semiconductor layer;
   a pixel electrode provided on the major surface and electrically connected to the switching element, the pixel electrode being light transmissive;
   an organic light emitting layer provided on the pixel electrode;
   an opposite electrode provided on the organic light emitting layer;
   a detecting electrode provided between the substrate and at least a part of the pixel electrode and including at least one element included in the semiconductor layer, the detecting electrode being light transmissive;
   an insulating layer provided between the pixel electrode and the detecting electrode, the insulating layer being light transmissive, the pixel electrode, the detecting electrode, and the insulating layer forming a detecting capacitor;
   an amplifier transistor having a gate electrode, the gate electrode being electrically connected to the detecting capacitor; and
   an output signal line being electrically connected to the amplifier transistor, the amplifier transistor passing a current depending on a capacitance of the detecting capacitor to the output signal line,
   wherein the semiconductor layer and the detecting electrode each independently comprise an amorphous oxide which comprises at least one of In, Ga, and Zn.

2. The panel according to claim 1, wherein a difference between a distance between the detecting electrode and the substrate along a first direction perpendicular to the major surface and a distance between the semiconductor layer and the substrate along the first direction is 10 nm or less.

3. The panel according to claim 1, wherein a thickness of the semiconductor layer is 10 nm or more and 100 nm or less.

4. The panel according to claim 1, wherein
   the insulating layer includes an organic layer, and
   a thickness of the organic layer along a first direction perpendicular to the major surface is 1 μm or more 10 μm or less.

5. The panel according to claim 1, wherein
   the insulating layer includes a contact layer contacting the detecting electrode, and
   the contact layer includes at least one of a silicon oxide film, a silicon oxynitride film, and a silicon nitride film.

6. The panel according to claim 5, wherein the contact layer includes hydrogen at a concentration of $1 \times 10^{19}$ atoms/cm$^3$ or more.

7. The panel according to claim 5, wherein a thickness of the contact layer is 100 nm or more and 200 nm or less.

8. The panel according to claim 1, wherein
   the substrate includes at least one of a polyimide resin and an aramid resin, and
   the substrate is flexible.

9. The panel according to claim 1, wherein the opposite electrode includes at least one of Al and MgAg.

10. The panel according to claim 1, wherein a thickness of the opposite electrode is 5 nm or more 500 nm or less.

11. The panel according to claim 1, wherein the pixel electrode includes one of an ITO, an ITO/Ag/ITO stacked structure, and ZnO including Al.

12. The panel according to claim 1, wherein
    the switching element includes
    a gate electrode provided on the major surface,
    a gate insulating film provided on the gate electrode,
    the semiconductor layer provided on the gate insulating film, the semiconductor layer including a first region, a second region apart from the first region, and a third region provided between the first region and the second region,
    a first conducting portion electrically connected to the first region and the pixel electrode, and
    a second conducting portion provided apart from the first conducting portion and electrically connected to the second region.

13. The panel according to claim 12, wherein the detecting electrode is provided on the gate insulating film.

14. The panel according to claim 12, wherein
    the switching element further includes a channel protection film provided at least on the third region.

15. The panel according to claim 1, further comprising a sealing layer provided on the opposite electrode,
    the sealing layer including at least one of a silicon oxide film, a silicon oxynitride film, a silicon nitride film, alumina, and a tantalum oxide film.

16. The panel according to claim 1, wherein the semiconductor layer and the detecting electrode each independently comprise an amorphous oxide selected from the group consisting of an In—Ga—Zn—O oxide semiconductor, an In—Ga—O oxide semiconductor, and an In—Zn—O oxide semiconductor.

17. The panel according to claim 1, wherein the semiconductor layer and the detecting electrode each comprise the same amorphous oxide.

18. A display device comprising:
    a display panel including:
    a substrate having a major surface, the substrate being light transmissive;
    a switching element provided on the major surface and including a semiconductor layer;
    a pixel electrode provided on the major surface and electrically connected to the switching element, the pixel electrode being light transmissive;

an organic light emitting layer provided on the pixel electrode;

an opposite electrode provided on the organic light emitting layer;

a detecting electrode provided between the substrate and at least a part of the pixel electrode and including at least one element included in the semiconductor layer, the detecting electrode being light transmissive;

an insulating layer provided between the pixel electrode and the detecting electrode, the insulating layer being light transmissive, the pixel electrode, the detecting electrode, and the insulating layer forming a detecting capacitor;

an amplifier transistor having a gate electrode, the gate electrode being electrically connected to the detecting capacitor;

an output signal line being electrically connected to the amplifier transistor, the amplifier transistor passing a current depending on a capacitance of the detecting capacitor to the output signal line; and a control unit configured to control an operation of the switching element to control a light emitted from the organic light emitting layer and configured to detect a capacitance of a detecting capacitor formed of the pixel electrode, the detecting electrode, and the insulating film, wherein the semiconductor layer and the detecting electrode each independently comprise an amorphous oxide which comprises at least one of In, Ga, and Zn.

19. The device according to claim 18, wherein the control unit inputs a signal to emit the light from the organic light emitting layer to the switching element, subsequent to the detecting the capacitance.

20. The device according to claim 19, wherein the control unit is configured to input a first signal at a first timing to emit the light to the switching element; and input a second signal at a second timing to emit the light to the switching element, the second timing is after the first timing, and the detecting is performed in a latter period between the first timing and the second timing.

21. The display device according to claim 18, wherein the semiconductor layer and the detecting electrode each independently comprise an amorphous oxide selected from the group consisting of an In—Ga—Zn—O oxide semiconductor, an In—Ga—O oxide semiconductor, and an In—Zn—O oxide semiconductor.

22. The display device according to claim 18, wherein the semiconductor layer and the detecting electrode each comprise the same amorphous oxide.

\* \* \* \* \*